(12) United States Patent
Stephens, Jr. et al.

(10) Patent No.: US 6,764,867 B1
(45) Date of Patent: Jul. 20, 2004

(54) RETICLE OPTION LAYER DETECTION METHOD

(75) Inventors: Michael C. Stephens, Jr., San Jose, CA (US); Christopher Ematrudo, Campbell, CA (US); Jeffrey S. Earl, San Jose, CA (US)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 255 days.

(21) Appl. No.: 09/764,243

(22) Filed: Jan. 19, 2001

(51) Int. Cl.$^7$ .................................................... H01L 21/00
(52) U.S. Cl. ....................... 438/14; 382/145; 430/30; 716/4
(58) Field of Search ............................ 438/14; 716/4; 430/30

(56) References Cited

U.S. PATENT DOCUMENTS

| | | | |
|---|---|---|---|
| 4,758,863 A | | 7/1988 | Nikkel .......................... 355/40 |
| 5,654,588 A | * | 8/1997 | Dasse et al. .................. 257/754 |
| 5,747,868 A | | 5/1998 | Reddy et al. ................. 257/529 |
| 5,777,901 A | * | 7/1998 | Berezin et al. ............... 716/19 |
| 5,907,492 A | | 5/1999 | Akram et al. ............. 364/468.28 |
| 5,940,704 A | | 8/1999 | Takeuchi ...................... 438/257 |
| 6,421,111 B1 | * | 7/2002 | Pierrat .......................... 355/53 |

* cited by examiner

*Primary Examiner*—W. David Coleman
(74) *Attorney, Agent, or Firm*—George O. Saile; Stephen B. Ackerman; Douglas R. Schnabel

(57) ABSTRACT

A new method of detecting a reticle option layer in an integrated circuit device has been achieved. The method may be applied to detect the presence of the threshold voltage implantation reticle option layer by direct die probing or by probing a pin of a package integrated circuit. The current through a first MOS transistor is measured by forcing a test voltage on the drain and the gate. The gate and the drain of the first MOS transistor are connected together while the source is connected to a reference voltage. The first MOS transistor has the standard threshold implantation but not the threshold voltage reticle option. The current through a second MOS transistor is measured by forcing the same test voltage on the drain and the gate. The gate and said drain of the second MOS transistor are connected together while the source is connected to a reference voltage. The second MOS transistor has the standard threshold voltage implantation and the threshold voltage implantation reticle option layer. The current through the first NMOS transistor and the current through the second MOS transistor are compared to detect the presence of the threshold voltage implantation reticle option layer in the integrated circuit device.

24 Claims, 7 Drawing Sheets

RETICLE OPTION LAYER DETECTION METHOD

BACKGROUND OF THE INVENTION (1) Field of the Invention

The invention relates to reticle options in a semiconductor device, and more particularly, to a method of detecting reticle option layers in an integrated circuit device.

(2) Description of the Prior Art

During the early stages of product development, it is important to get test data based on actual silicon as soon as possible. One way to expedite this data availability on a new product is to include several chip layer versions on the same reticle. So, depending on the number of chip pattern placements within the reticle, there can be up to that number of layer versions on the reticle. The most promising of the layer versions, based on test results, could then be selected and implemented as a single version for the production reticle.

To facilitate testing and evaluation of the integrated circuit, a means of easily identify layer versions is needed. Ideally, such versions should be identified electrically either by directly probing the die or by probing individual pins of packaged circuit. The only known prior art approach to provide electrical identification of a layer version is through the use of existing redundancy or chip identification fuses that are either connected or disconnected based on a metal layer version. However, this approach is limited in terms of the layers that can be used as reticle versions.

Several prior art approaches relate to reticle layers, identification, and related methods. U.S. Pat. No. 5,940,704 to Takeuchi discloses a method of making a reference apparatus for determining current or voltage in nonvolatile memory cells. The reference apparatus comprises cells with different threshold voltages due to differences in the floating gate to control gate coupling ratios. The current in the nonvolatile cell is compared to that in the reference cells using a sense amplifier. U.S. Pat. No. 5,747,868 to Reddy et al teaches a method to form polysilicon laser fusible links in an integrated circuit device. U.S. Pat. No. 4,758,863 to Nikkel illustrates a multilevel reticle having multiple masks of integrated circuit patterns. U.S. Pat. No. 5,907,492 to Akram et al teaches a method for use in an integrated circuit manufacturing process. Data from repair procedures conducted at wafer probe is used to determine whether further repairs will be performed. This method uses a laser fuse identification code to track repair procedures performed.

SUMMARY OF THE INVENTION

A principal object of the present invention is to provide an effective method of detecting the presence of a reticle option layer in an integrated circuit device.

A further object of the present invention is to provide a method of detecting reticle option layers in an integrated circuit device by electrically measuring the performance of two MOS transistors where the electrical performance of one transistor is affected by the presence of the reticle option while the other transistor is a standard, or control device.

A yet further object of the present invention is to provide a method of detecting reticle option layers where the reticle option layer is a threshold implantation.

Another further object of the present invention is to provide a method of detecting reticle option layers by directly probing the integrated circuit die.

Another further object of the present invention is to provide a reticle detection method for use with either NMOS or PMOS transistors.

Another further object of the present invention is to provide a method of detecting reticle option layers by probing the pins of the packaged integrated circuit.

Another yet further object of the present invention is to detect reticle option layers by probing the pins of the packaged circuit where a selection and amplification circuit facilitates access to the MOS transistors from the package pins.

Another still further object of the present invention is to detect reticle option layers by probing the pins of the packaged circuit where a selection and amplification circuit facilitates access to the MOS transistors from the package pins where either NMOS or PMOS transistors are sensed.

In accordance with the objects of this invention, a new method of detecting a threshold voltage implantation reticle option layer in an integrated circuit device has been achieved. The current through a first MOS transistor in an integrated circuit device is measured by forcing a test voltage on the drain and the gate. The gate and the drain of the first MOS transistor are connected together while the source of the first MOS transistor is connected to a reference voltage. The first MOS transistor has the standard threshold voltage implantation but not the threshold voltage implantation reticle option layer. The current through a second MOS transistor in the integrated circuit device is measured by forcing the same test voltage on the drain and the gate. The gate and the drain of the second MOS transistor are connected together while the source of the second MOS transistor is connected to the same reference voltage. The second MOS transistor has both the standard threshold voltage implantation and the threshold voltage implantation reticle option layer. The current through the first MOS transistor and the current through the second MOS transistor are compared to detect the presence of the threshold voltage implantation reticle option layer in the integrated circuit device. The method may be used for either NMOS or PMOS transistors.

Also in accordance with the objects of this invention, a new method of detecting a threshold voltage implantation reticle option layer in an integrated circuit device has been achieved. A first NMOS transistor in an integrated circuit device is selected in a first test mode so that the voltage at the drain and the gate of the first NMOS transistor may be measured at an output pin of the integrated circuit device. The gate and the drain of the first NMOS transistor are connected together. The first NMOS transistor has the standard threshold voltage implantation but not the threshold voltage implantation reticle option layer. The voltage at the output pin in the first test mode is measured when an internal standard voltage is connected to the drain and the gate through an internal standard resistance while the source of the first NMOS transistor is connected to ground. A second NMOS transistor in the integrated circuit device is selected in a second test mode so that the voltage at the drain and the gate of the second NMOS transistor may be measured at the output pin of the integrated circuit device. The gate and the drain of the second NMOS transistor are connected together. The second NMOS transistor has both the standard threshold voltage implantation and the threshold voltage implantation reticle option layer. The voltage at the output pin in the second test mode is measured when the internal standard voltage is connected to the drain and the gate through the internal standard resistance while the source of the NMOS transistor is connected to ground. The voltage at the output pin in the first test mode is compared with the voltage at the output pin in the second test mode to detect the presence of the threshold voltage implantation reticle option layer in the integrated circuit device.

Also in accordance with the objects of this invention, a new method of detecting a threshold voltage implantation reticle option layer in an integrated circuit device has been achieved. A first PMOS transistor in an integrated circuit device is selected in a first test mode so that the voltage at the drain and the gate of the first PMOS transistor may be measured at an output pin of the integrated circuit device. The gate and the drain of the first PMOS transistor are connected together. The first PMOS transistor has the standard threshold voltage implantation but not the threshold voltage implantation reticle option layer. The voltage at the output pin in the first test mode is measured when an internal standard voltage is connected to the source while the drain and the gate are connected to ground through an internal standard resistance. A second PMOS transistor in the integrated circuit device is selected in a second test mode so that the voltage at the drain and the gate of the second PMOS transistor may be measured at the output pin of the integrated circuit device. The gate and the drain of the second PMOS transistor are connected together. The second PMOS transistor has both the standard threshold voltage implantation and the threshold voltage implantation reticle option layer. The voltage at the output pin in the second test mode is measured when the internal standard voltage is connected to the source while the drain and the gate are connected to ground through the internal standard resistance. The voltage at the output pin in the first test mode is compared with the voltage at the output pin in the second test mode to detect the presence of the threshold voltage implantation reticle option layer in the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiments disclose the application of the present invention to the detection of a reticle option layer in an integrated circuit device. It should be clear to those experienced in the art that the present invention can be applied and extended without deviating from the scope of the present invention.

Figure 1:
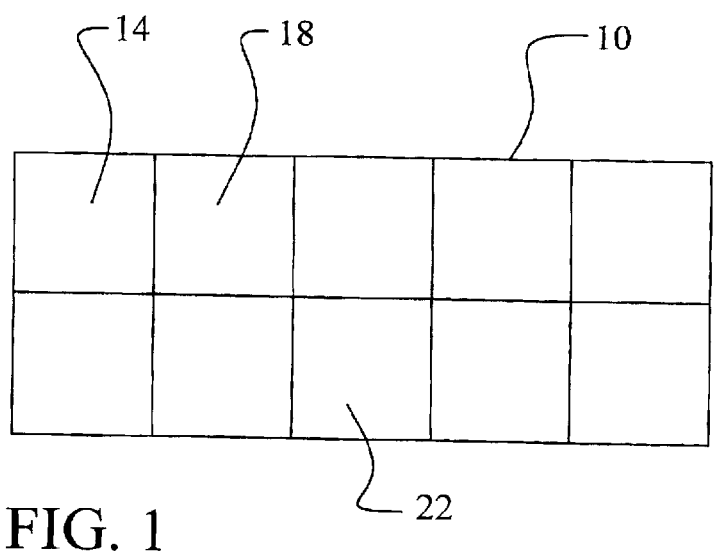
FIG. 1 illustrates a top view of a photolithographic reticle for an integrated circuit device.

Referring now particularly to FIG. 1, there is shown a top view of a photolithographic reticle 10 for an integrated circuit device. Photolithography is an integral processing method in the art of integrated circuit manufacturing. Photolithography is used to pattern a light sensitive material, such as photoresist, in process steps that define the many layers, features, and devices on the integrated circuit.

More specifically, a photoresist layer is applied overlying the surface of the integrated circuit. The photoresist layer is then exposed to actinic light through a mask or reticle 10. After light exposure, the photoresist is developed to leave a copy of the pattern, or its negative image, on the surface of the integrated circuit. The mask exposure step is performed in a lithographic exposure machine, commonly called an optical printer.

A particular form of optical printer that is commonly used in the art is called the optical stepper. In an optical stepper, the use of the reticle 10 allows several copies of an integrated circuit layer to be exposed onto the photoresist at once. In the example reticle 10, ten individual die are exposed on the wafer at one time. Through the use of the reticle 10, it is also possible to form different designs on each of the ten locations. For example, the first die location 14 and the second die location 18 could be different designs or products. Yet another product could be included at some other location 22 in the reticle array.

More important for the present invention, each die locations could include slight variations in the circuit design of an integrated circuit. Such variations could represent, but are not limited to, process variations intentionally included on circuits during the product development stage. For example, the width features of the polysilicon layer could be varied slightly between the first location 14 and the second location 18. If the product under development were a MOS device, this variation in polysilicon width would likely have a significant impact on the performance of the completed circuits. Using the reticle array 10 in this way offers important advantages in the product development process. First, experimental data variation can be achieved quickly. Second, since the variation is between die on the same integrated circuit wafer, wafer-to-wafer or lot-to-lot variations are eliminated in the data analysis.

Specific to the first and second preferred embodiments of the present invention, the ability to pattern each die of the reticle differently for a given layer is advantageously used. These layer variations, so useful for product development, are herein used to create a method whereby the presence of a particular layer or layer variation can be detected by an electrical parametric test.

Figure 2:
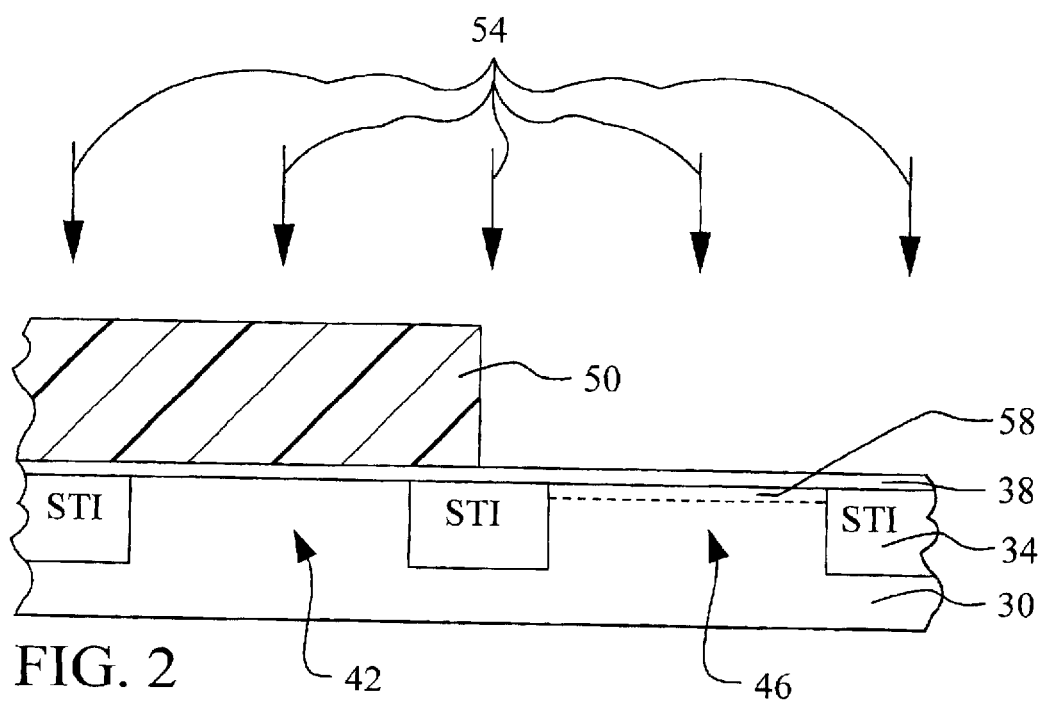
FIGS. 2 and 3 schematically illustrate in cross-sectional representation the formation of a pair of NMOS transistors as used in the present invention.

Referring now to FIG. 2, a cross-sectional representation of a partially completed integrated circuit device of the first and second preferred embodiments is shown. A semiconductor substrate 30 is provided. Isolation regions 34 are formed in the semiconductor substrate 30 to separate active device areas. A sacrificial or pad oxide layer 38 is formed overlying the semiconductor substrate 30.

Two MOS transistors 42 and 46 are formed in the semiconductor substrate 30. The method of the present invention uses the MOS transistors 42 and 46 in the layer detection method. Each transistor is preferably formed with the same layout orientation, with the same size, and in close proximity to the other transistor so that the parametric performance of the transistors 42 and 46 should be identical. However, since a layer of the fabrication process is patterned such that a process or size difference is introduced between the transistors 42 and 46, then a parametric performance difference would exist between the transistors. This parametric difference would then be detectable using an electrical test where current and voltage measurements are made on each device 42 and 46. Two distinct conditions would then exist. In the first case, if the transistors 42 and 46 generate identical or near identical parametric measurement, then it can be concluded that the specific layer, that is herein called the reticle option layer, was not used on this integrated circuit. In the second case, if the transistors 42 and 46 generate different parametric measurements, then it can be concluded that the reticle option layer was used on this integrated circuit.

Referring again to FIG. 2, the first and second preferred embodiments of the present invention illustrate the case where the reticle option layer is an extra implant layer that reduces the threshold voltage ($V_t$) of MOS transistors that have the additional layer. This reticle option layer is called the threshold voltage implantation reticle option layer. This reticle option layer is defined so that one chip version on the reticle 10 of FIG. 1 has the standard $V_t$ while another chip version on the reticle 10 has the low $V_t$. By comparing the standard and low $V_t$ versions, it is possible to quickly test and improve the chip design.

The partially completed integrated circuit of FIG. 2 therefore represents the low $V_t$ case where the additional implant layer is used in the process of the die. A photoresist layer 50 is first deposited overlying the sacrificial oxide layer 38. The photoresist layer 50 is then patterned using the threshold voltage implantation reticle option layer. After the photoresist layer 50 is developed, one transistor 46 is exposed while the other transistor 42 is covered. Ions are implanted 54 into the semiconductor substrate 30 where the patterned photoresist layer 50 exposes the substrate. A channel layer 58 is thereby formed to reduce the $V_t$ of one MOS transistor 46. This transistor is called the low $V_t$ transistor 46. The standard $V_t$ transistor 42 is not implanted and therefore does not exhibit a relatively reduced $V_t$.

Note that the entire integrated circuit wafer is implanted during the low $V_t$ implant. The reticle option threshold voltage layer may be patterned so that all NMOS transistors in the circuit design receive the implant and therefore exhibit a lowered $V_t$. Alternatively, the reticle option threshold voltage layer may be patterned so that only some of the NMOS transistors in the circuit exhibit a lowered $V_t$. Note also that none of the NMOS transistors on the standard $V_t$ chip version receive this implant because the reticle option threshold voltage layer is not present at this reticle location. In this process scheme, the standard $V_t$ NMOS transistors have a threshold voltage of between about 0.7 Volts and 0.9 Volts. Low $V_t$ NMOS transistors have a threshold voltage of between about 0.5 Volts and 0.7 Volts.

Figure 3:
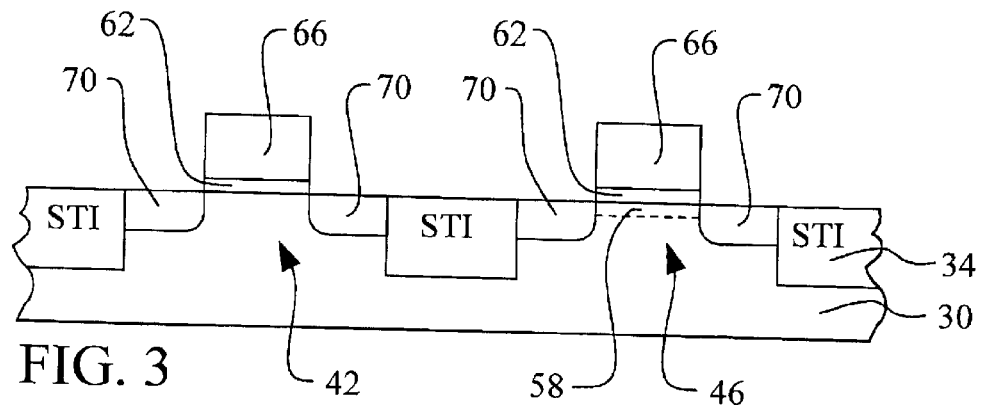

Referring now to FIG. 3, the photoresist layer 50 and the sacrificial oxide layer 38 are removed. Using a conventional process, the MOS transistors 42 and 46 are then completed. For example, a gate oxide layer 62 is grown overlying the semiconductor substrate. A polysilicon layer 66 is deposited overlying the gate oxide layer 62. The polysilicon layer 66 and the gate oxide layer 62 are patterned to complete the gates of the MOS transistor pair 42 and 46. Ions are then implanted into the semiconductor substrate 30 to form the source and drain junctions 70.

Figure 4:
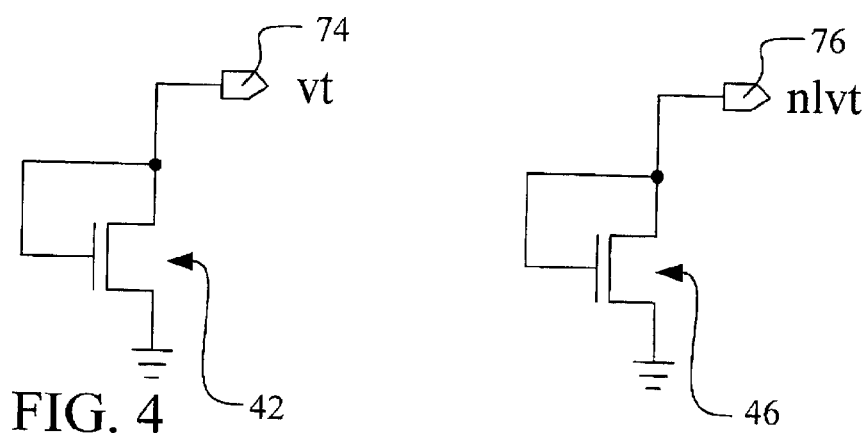
FIGS. 4 and 5 schematically illustrate a first preferred embodiment of the present invention.

Referring now to FIG. 4, a NMOS transistor pair 42 and 46 is shown in schematic form. Note that the source junctions of each device are connected to the ground reference of the integrated circuit, typically called VSS. The gate and drain junctions are connected together so that the NMOS transistors are configured as MOS diodes. The gate and drain junctions of the standard $V_t$ device 42 are connected together to form the node labeled vt 74. The gate and drain junctions of the low $V_t$ device 46 are connected together to form the node labeled nlvt 76.

Figure 5:
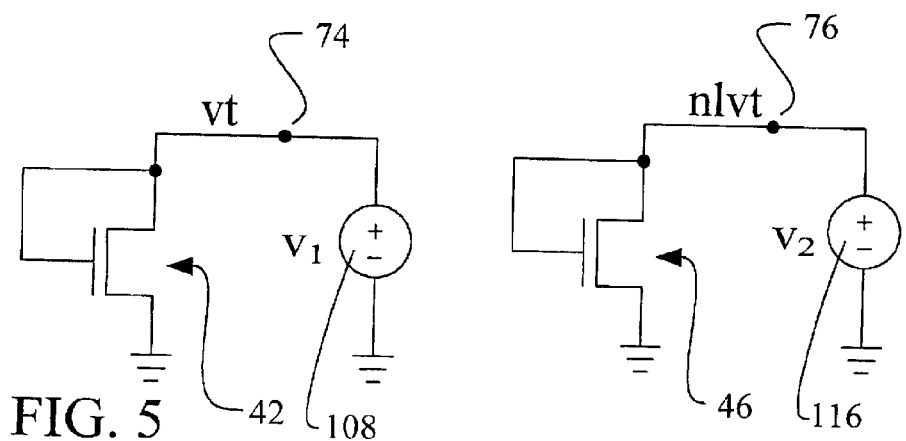

Referring now to FIG. 5, several important features of the method of the first preferred embodiment of the present invention are illustrated. In the first preferred embodiment, the method of the present invention allows the threshold voltage implantation reticle option layer to be detected using an electrical parametric test by directly probing the integrated circuit die. The method of detection is as follows. First, the vt node 74 of the standard $V_t$ NMOS transistor 42 is probed. A power supply $V_1$ 108 is used to force a DC voltage across the vt node 74 and the ground reference. The current flowing through the standard $V_t$ NMOS transistor 42 is measured. Next, the nlvt node 76 of the low $V_t$ NMOS transistor 46 is probed. A power supply $V_2$ 116 is used to force a DC voltage across the nlvt node 76 and the ground reference. The current flowing through the low $V_t$ NMOS transistor 46 is measured. Finally, the current measurements for each transistor 42 and 46 are compared.

The delta between the current measurements, or between calculated voltage thresholds based upon the current measurements, of each transistor is important. The exact delta that would constitute a definitive conclusion of the test is based on a statistical analysis of die probes in the particular CMOS process with and without the particular optional threshold implantation.

Figure 6:
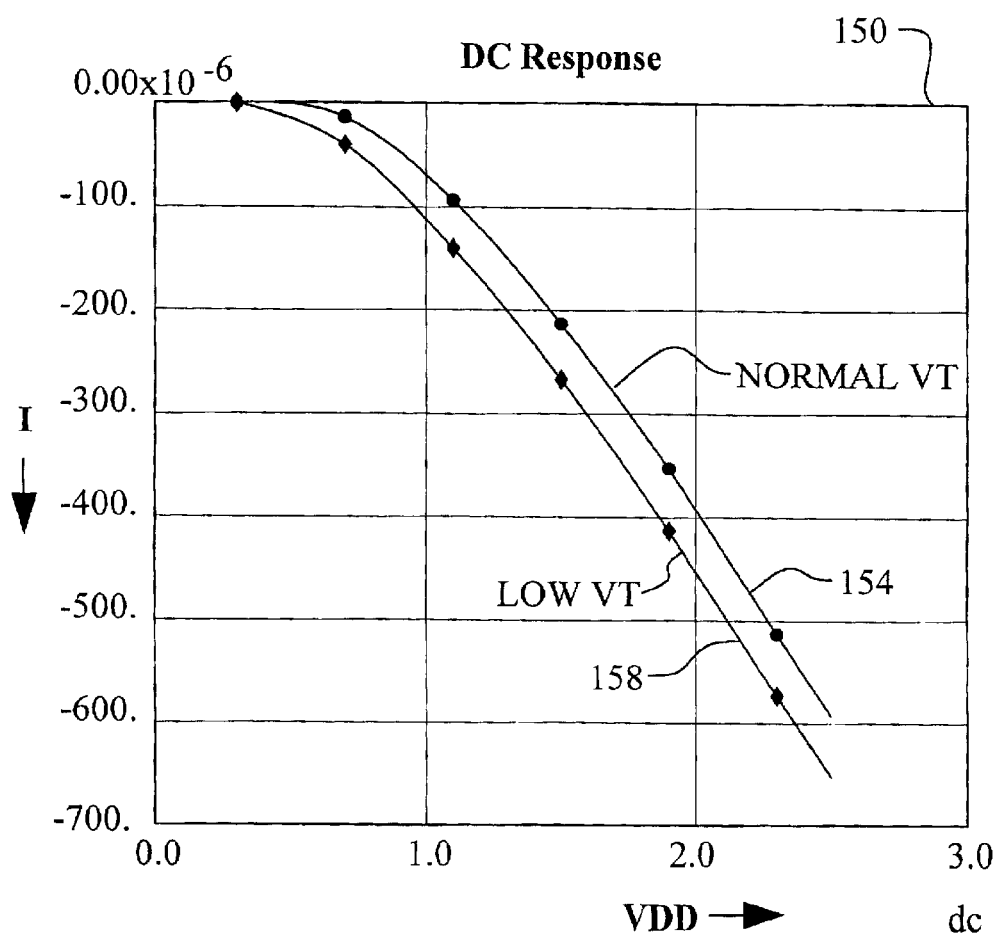
FIG. 6 graphically illustrates the parametric performance of the first preferred embodiment of the present invention.

Referring now to FIG. 6, the parametric performance of the low $V_t$ NMOS transistor 46 and the standard $V_t$ NMOS transistor 42 are compared. The graph 150 shows the results of a simulated DC voltage sweep performed on each device. The MOS diode current versus the power supply voltage is plotted. As expected, the low $V_t$ NMOS transistor 46 curve 158 demonstrates a higher absolute value of current than the standard $V_t$ NMOS transistor 46 curve 154. The resulting calculated $V_t$ for each transistor verifies that one device has a significantly different $V_t$. This difference confirms that the probed integrated circuit die was the version that received the threshold voltage implantation reticle option layer. However, if the low $V_t$ NMOS transistor 46 curve 158 and the standard $V_t$ NMOS transistor 46 curve 154 were closely correlated, the conclusion would be that each device had the same threshold. In this case, the probed integrated circuit die would be a standard threshold implant version.

Figure 7:
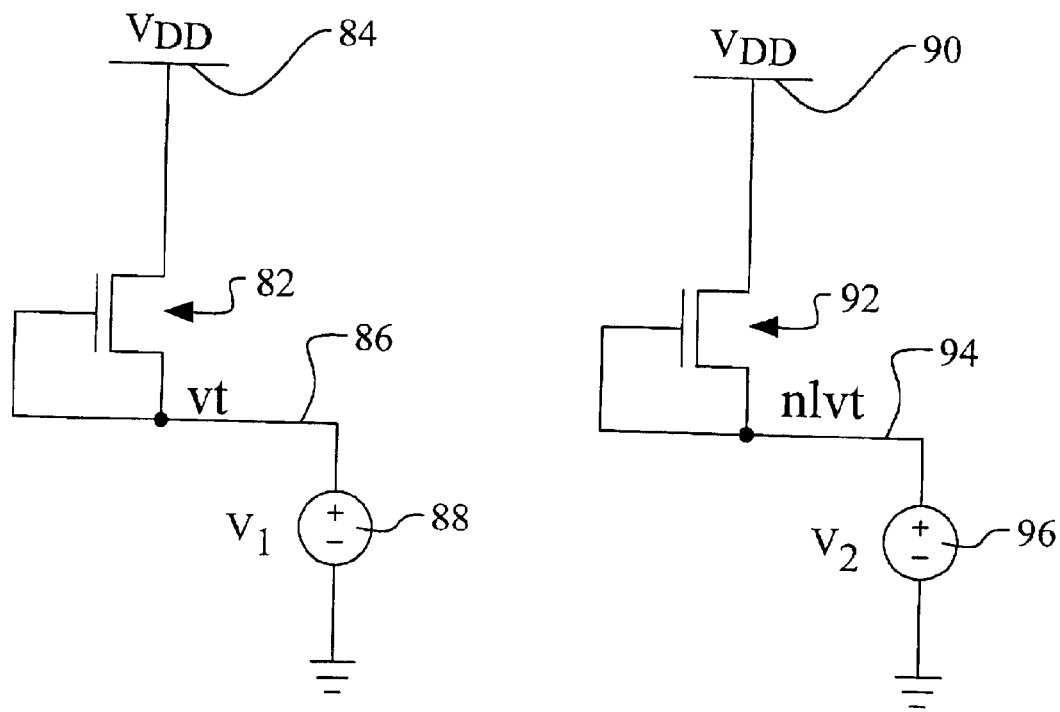
FIG. 7 schematically illustrates the first preferred embodiment where PMOS transistors are used as the sensing structures.

Referring now to FIG. 7, the first preferred embodiment of the present invention is applied using PMOS transistors rather than NMOS transistors. Note that the source junctions of each PMOS transistor 82 and 92 are connected to the standard voltage supply 84 and 90 of the integrated circuit, typically called VDD. The gate and drain junctions are connected together so that the PMOS transistors are configured as MOS diodes. The gate and drain junctions of the standard $V_t$ device 82 are connected together to form the node labeled vt 86. The gate and drain junctions of the low $V_t$ device 92 are connected together to form the node labeled nlvt 94.

First, the vt node 86 of the standard $V_t$ PMOS transistor 82 is probed. A power supply $V_1$ 88 is used to force a DC voltage across the vt node 86 and the ground reference. The current flowing through the standard $V_t$ PMOS transistor 82 is measured. Next, the nlvt node 94 of the low $V_t$ PMOS transistor 92 is probed. A power supply $V_2$ 96 is used to force a DC voltage across the nlvt node 94 and the ground reference. The current flowing through the low $V_t$ PMOS transistor 92 is measured. Finally, the current measurements for each transistor 82 and 92 are compared.

Figure 8:
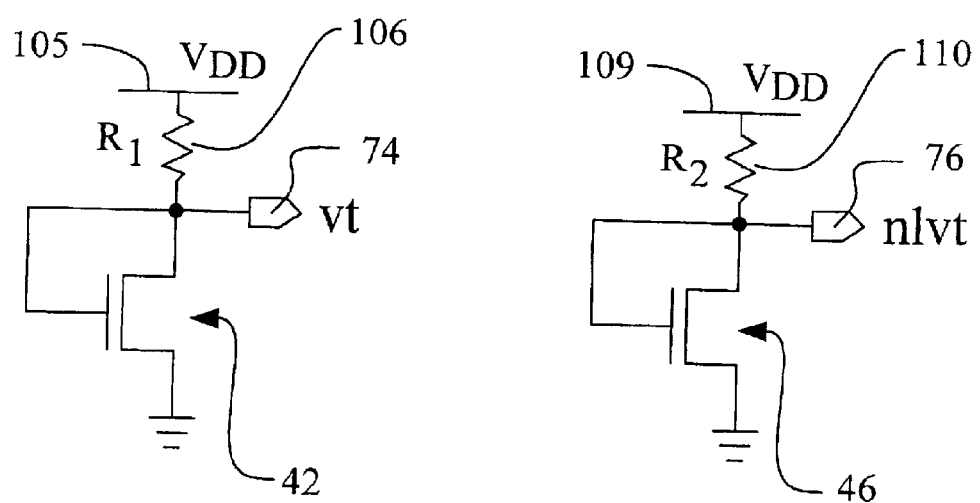
FIGS. 8 and 9 schematically illustrate a second preferred embodiment of the present invention.

Referring now to FIG. 8, a second preferred embodiment of the present invention is illustrated. In the second embodiment, the method of the present invention facilitates threshold voltage implantation reticle option layer detection by probing an external pin of a packaged integrated circuit device. The NMOS transistor pair 42 and 46 is fabricated as described in the first preferred embodiment. The drain and gate junctions of the standard $V_t$ NMOS transistor 42 and the low $V_t$ NMOS transistor 46 are connected together to form a pair of MOS diodes. The source junctions of each device 42 and 46 are connected to the reference ground.

The drain and gate junctions of the standard $V_t$ NMOS transistor 42 are again connected to a node that is herein called vt 74. In the second embodiment, however, an internal voltage supply 105, commonly called VDD, is connected to the vt node 74 through a resistor $R_1$ 106. The presence of the voltage supply 105 and the resistor $R_1$ 106 creates a current source circuit. The voltage on the vt node 74 will again depend upon the threshold voltage of the standard $V_t$ NMOS transistor 42.

The drain and gate junctions of the low $V_t$ NMOS transistor 46 are again connected to a node that is herein called nlvt 76. An internal voltage supply 109, commonly called VDD, is connected to the nlvt node 76 through a resistor $R_2$ 110. The presence of the voltage supply 109 and the resistor $R_2$ 110 creates a current source circuit. The voltage on the nlvt node 76 will again depend upon the threshold voltage of the low $V_t$ NMOS transistor 46.

The value of the resistors $R_1$ 106 and $R_2$ 110 are preferably the same. The resistors are preferably formed on the integrated circuit die using layout techniques that facilitate closely matching each resistor in the pair. The voltage supply VDD 105 and 109 is preferably the main power supply for the integrated circuit device and has a value of between about 2.0 Volts and 3.3 Volts. The method of the present invention will work for a wide variety of voltages and resistor values.

Figure 9:
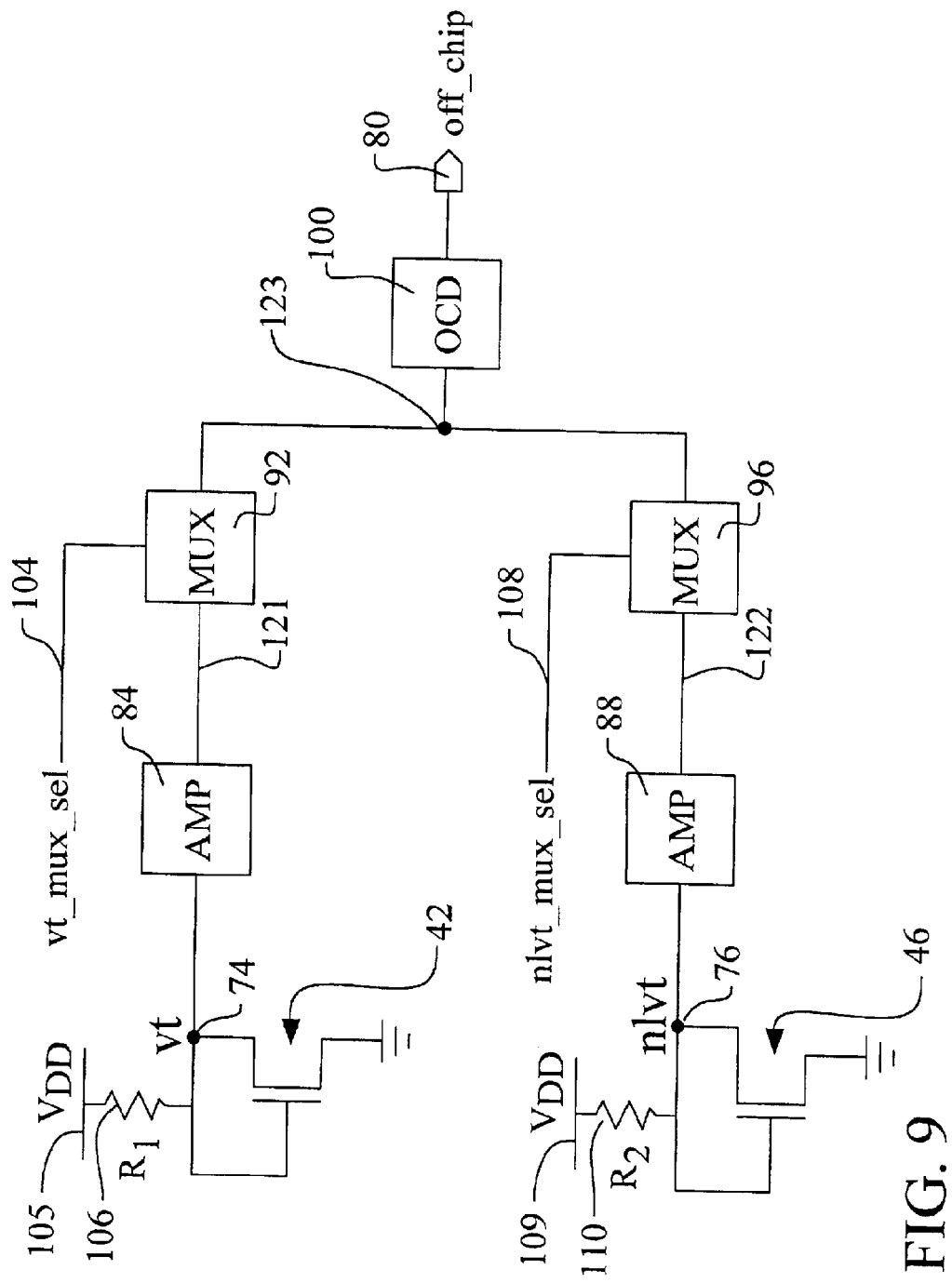

Referring now to FIG. 9, several important features of the second preferred embodiment are illustrated. The method of the second preferred embodiment is to provide access to the NMOS transistor pair 42 and 46 at a single integrated circuit pin so that the chip version can be identified with a pair of simple parametric measurements. The off_chip node 80 is an output pin of the integrated circuit. The Off Chip Driver (OCD) block 100 is a typical analog output circuit that may include electrostatic discharge protection. The OCD block 100 passes the voltage of node 123 to the output pin. The OCD block 100 translates the input level 123 to an output level 80 that is compatible with the interface circuit in use. For example, the level could be translated for compatibility with low voltage transistor-transistor logic (LVTTL). The output drive must be strong enough to drive all of the loading capacitance on the integrated circuit pin.

Two separate paths are connected to the OCD block 100 through multiplex (MUX) blocks 92 and 96. Together, the MUX blocks 92 and 96 function in one of two states. When vt_mux_sel 104 is asserted and nlvt_mux_sel 108 is de-asserted, then MUX block 92 is in an active state and MUX block 96 is in a high impedance state. In this state, the standard $V_t$ NMOS transistor 42 is selected for measurement. Conversely, when vt_mux_sel 104 is de-asserted and nlvt_mux_sel 108 is asserted, then MUX block 96 is in an active state and MUX block 92 is in a high impedance state. In this state, the low $V_t$ NMOS transistor 46 is selected for measurement. The MUX blocks 92 and 96 are standard designs for a CMOS process and ideally have minimum voltage offset. The MUX blocks 92 and 96 are preferably identical.

Amplifier (AMP) blocks 84 and 88 may be used to amplify the vt node 74 and the nlvt node 76 signals if the signal strength is very weak. The current bias, set by the size of the resistors $R_1$ 106 and $R_2$ 110 and the size of the NMOS pair 42 and 46 determines the signal strength. If used, the AMP blocks 84 and 88 are again standard designs for a CMOS process.

The novel detection method begins with the selection of the standard $V_t$ NMOS transistor 42 by the assertion of the vt_mux_sel signal 104 and the de-assertion of the nlvt_mux_sel signal 108. The vt_mux_sel signal 104 and nlvt_mux_sel signal 108 are preferably controlled by an integrated test mode logic block. They may alternatively be controlled through an external integrated circuit pin. Once the vt_mux_sel signal is asserted, the bias voltage of the vt node 74 is available at the output pin off_chip 80 through the MUX block 92. The voltage at off_chip 80 is easily measured and recorded. Next, the vt_mux_sel signal 104 is de-asserted and the nlvt_mux_sel signal 108 is asserted to cause the selection of MUX block 96. The low $V_t$ NMOS transistor 46 is thereby selected. The bias voltage of the nlvt node 76 is available at the output pin off_chip 80. The voltage at off_chip 80 is again easily measured and recorded.

The first and second off_chip 80 voltage readings are then compared. If the first and second readings are nearly identical, then it may be concluded that this integrated circuit package did not receive the threshold voltage implantation reticle option layer. Therefore, this is the standard $V_t$ chip version. If the first reading is higher than the second reading by a substantial margin, then it may be concluded that this integrated circuit package did receive the threshold voltage implantation reticle option layer. This is the low Vt chip version.

The delta between the voltage measurements of each transistor is important. The exact delta that would constitute a definitive conclusion of the test is based on a statistical analysis of die probes in the particular CMOS process with and without the particular optional threshold implantation.

Figure 10:
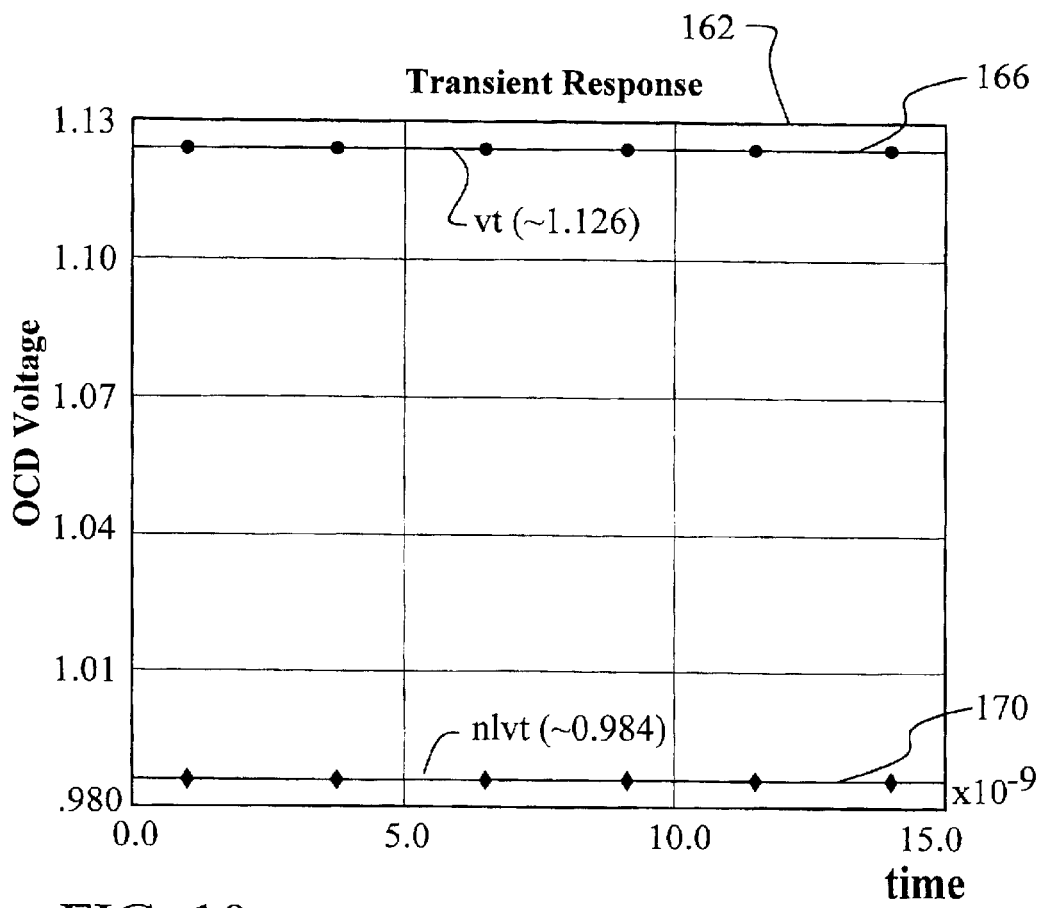
FIG. 10 graphically illustrates the parametric performance of the second preferred embodiment of the present invention.

Referring now to FIG. 10, the parametric performance of the low $V_t$ NMOS transistor 46 and the standard $V_t$ NMOS transistor 42 as used in the second embodiment method are compared. The graph 162 shows the results of a simulated transient response performed on each device. The curve 170 for the nlvt node 76 of the low $V_t$ NMOS transistor 46 demonstrates a low voltage level of 0.984 Volts. The vt node 74 of the standard $V_t$ NMOS transistor 46 demonstrates a low voltage level of 1.126 Volts as shown by curve 166. By comparing these voltage readings using the novel method of the present invention, the presence of the threshold voltage implantation reticle option layer is easily discerned.

Figure 11:
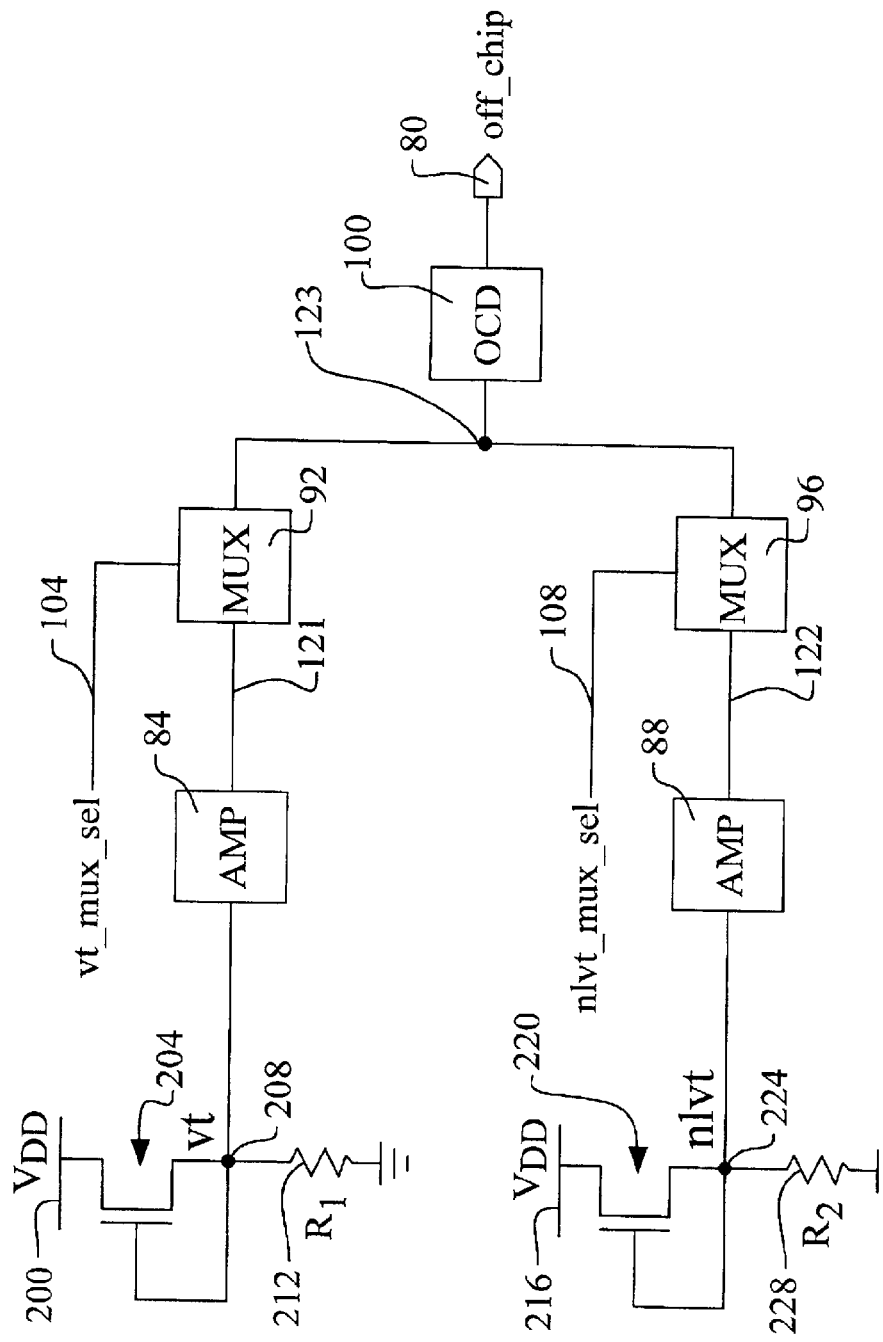
FIG. 11 schematically illustrates a third preferred embodiment of the present invention.

Referring now to FIG. 11, several important features of the third preferred embodiment are illustrated. Access to a PMOS transistor pair 204 and 220 at a single integrated circuit pin is provide in a fashion similar to that of the second embodiment.

Two separate paths are connected to the OCD block 100 through multiplex (MUX) blocks 92 and 96. Again, the MUX blocks 92 and 96 function in one of two states. When vt_mux_sel 104 is asserted and nlvt_mux_sel 108 is de-asserted, then MUX block 92 is in an active state and MUX block 96 is in a high impedance state. In this state, the standard $V_t$ PMOS transistor 204 is selected for measurement. Conversely, when vt_mux_sel 104 is de-asserted and nlvt_mux_sel 108 is asserted, then MUX block 96 is in an active state and MUX block 92 is in a high impedance state. In this state, the low $V_t$ PMOS transistor 220 is selected for measurement. Amplifier (AMP) blocks 84 and 88 may be used to amplify the vt node 208 and the nlvt node 224 signals if the signal strength is very weak. The current bias, set by the size of the resistors $R_1$ 212 and $R_2$ 228 and the size of the PMOS pair 204 and 220 determines the signal strength.

The novel detection method begins with the selection of the standard $V_t$ PMOS transistor 204 by the assertion of the vt_mux_sel signal 104 and the de-assertion of the nlvt_mux_sel signal 108. The vt_mux_sel signal 104 and nlvt_mux_sel signal 108 are preferably controlled by an integrated test mode logic block. They may alternatively be controlled through an external integrated circuit pin. Once the vt_mux_sel signal is asserted, the bias voltage of the vt node 208 is available at the output pin off_chip 80 through the MUX block 92. The voltage at off_chip 80 is easily measured and recorded. Next, the vt_mux_sel signal 104 is de-asserted and the nlvt_mux_sel signal 108 is asserted to cause the selection of MUX block 96. The low $V_t$ PMOS transistor 220 is thereby selected. The bias voltage of the nlvt node 224 is available at the output pin off_chip 80. The voltage at off_chip 80 is again easily measured and recorded.

The first and second off_chip 80 voltage readings are then compared. If the first and second readings are nearly identical, then it may be concluded that this integrated circuit package did not receive the threshold voltage implantation reticle option layer. Therefore, this is the standard $V_t$ chip version. If the first reading is higher than the second reading by a substantial margin, then it may be concluded that this integrated circuit package did receive the threshold voltage implantation reticle option layer. This is the low Vt chip version.

The reticle option approach of the present invention could be expanded to include several types of reticle options. Any type of reticle option that would affect the transistor threshold ($V_T$) and/or the saturation current ($I_{DS}$) could be used. Polysilicon gate variations could also be used to create measurable differences in transistor performance. Finally, the more common metal connection layer reticle option could be incorporated into the method.

The method of the present invention could be applied to more complicated reticle options where several option layers are used together in forming circuitry so that the number of overall chip options can be expanded several times over. For example, polysilicon gate width and threshold implant could be varied in combination. In addition, metal options could be varied in combination with the polysilicon layer and/or the threshold implantation.

As shown in the preferred embodiments, the present invention provides an effective method for detecting the presence a reticle option layer in an integrated circuit device. The method uses a pair of MOS transistors that will exhibit different parametric performance if a reticle option layer is present. One embodiment allows detection of the reticle option layer by direct die probing and measurement of either NMOS or PMOS transistors. The second and third embodiments allow detection of the reticle option layer by probing a pin of the packaged integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method of detecting a reticle option layer in an integrated circuit device comprising:

measuring the current through a first MOS transistor in an integrated circuit device by forcing a test voltage on the drain and the gate wherein said gate and said drain of said first MOS transistor are connected together, wherein the source of said first MOS transistor is connected to a reference voltage, and wherein said first MOS transistor is not parametrically affected by a reticle option layer;

measuring the current through a second MOS transistor in said integrated circuit device by forcing same said test voltage on the drain and the gate wherein said gate and said drain of said second MOS transistor are connected together, wherein the source of said second MOS transistor is connected to a reference voltage, and wherein said second MOS transistor is parametrically affected by said reticle option layer; and comparing said current through said first MOS transistor and said current through said second MOS transistor to detect the presence of said reticle option layer in said integrated circuit device.

2. The method according to claim 1 wherein said reticle option layer comprises a threshold voltage implantation.

3. The method according to claim 1 wherein said reticle option layer comprises one of the group of: polysilicon, metal, and threshold implantation.

4. The method according to claim 1 wherein said first MOS transistor and said second MOS transistor are the same size, the same direction and in close proximity.

5. The method according to claim 1 wherein said reticle option layer comprises a combination of reticle layers.

6. The method according to claim 5 wherein said combination of reticle layers comprises the group of: polysilicon, metal, and threshold implantation.

7. The method according to claim 1 wherein said measuring of said current through said first MOS transistor and said measuring of said current through said second MOS transistor is by directly probing the die of said integrated circuit device.

8. The method according to claim 1 wherein said measuring of said current through said first MOS transistor and said measuring of said current through said second MOS transistor is by probing an output pin of packaged said integrated circuit device.

9. The method according to claim 1 wherein said first MOS transistor and said second MOS transistor comprise one of the group of: NMOS transistors and PMOS transistors.

10. A method of detecting a threshold voltage implantation reticle option layer in an integrated circuit device comprising:

measuring the current through a first MOS transistor in an integrated circuit device by forcing a test voltage on the drain and the gate wherein said gate and said drain of said first MOS transistor are connected together, wherein the source of said first MOS transistor is connected to a reference voltage, and wherein said first MOS transistor has a first threshold voltage implantation but not a threshold voltage implantation reticle option layer;

measuring the current through a second MOS transistor in said integrated circuit device by forcing same said test voltage on the drain and the gate wherein said gate and said drain of said second MOS transistor are connected together, wherein the source of said second MOS transistor is connected to a reference voltage, and wherein said second MOS transistor has both said first threshold voltage implantation and said threshold voltage implantation reticle option layer; and comparing said current through said first MOS transistor and said current through said second MOS transistor to detect the presence of said threshold voltage implantation reticle option layer in said integrated circuit device.

11. The method according to claim 10 wherein said first MOS transistor and said second MOS transistor are the same size, the same direction and in close proximity.

12. The method according to claim 10 wherein said measuring of said current through said first MOS transistor and said measuring of said current through said second MOS transistor is by directly probing the die of said integrated circuit device.

13. The method according to claim 10 wherein said measuring of said current through said first MOS transistor and said measuring of said current through said second MOS transistor is by probing an output pin of packaged said integrated circuit device.

14. The method according to claim 10 wherein said first MOS transistor and said second MOS transistor comprise one of the group of: NMOS transistors and PMOS transistors.

15. A method of detecting a threshold voltage implantation reticle option layer in an integrated circuit device comprising:

selecting a first NMOS transistor in an integrated circuit device in a first test mode to couple the voltage at the drain and the gate of said first NMOS transistor to an output pin of said integrated circuit device wherein said gate and said drain of said first NMOS transistor are connected together, wherein the source of said first NMOS transistor is connected to ground, and wherein said first NMOS transistor has a first threshold voltage implantation but not a threshold voltage implantation reticle option layer;

measuring said voltage at said output pin in said first test mode when an internal test voltage is connected to said drain and said gate of said first NMOS transistor through a first internal standard resistance;

selecting a second NMOS transistor in said integrated circuit device in a second test mode to couple the voltage at the drain and the gate of said second NMOS transistor to said output pin of said integrated circuit device wherein said gate and said drain of said second NMOS transistor are connected together, wherein the source of said NMOS transistor is connected to ground, and wherein said second NMOS transistor has both said first threshold voltage implantation and said threshold voltage implantation reticle option layer;

measuring said voltage at said output pin in said second test mode when said internal test voltage is connected to said drain and said gate of said second NMOS transistor through a second internal standard resistance; and comparing said voltage at said output pin in said first test mode with said voltage at said output pin in said second test mode to detect the presence of said threshold voltage implantation reticle option layer in said integrated circuit device.

16. The method according to claim 15 wherein said selecting of said first NMOS transistor is by a multiplex circuit and wherein said selecting of said second NMOS is by a multiplex circuit.

17. The method according to claim 15 further comprising amplifying said voltage at said drain and said gate of said first NMOS transistor and said second NMOS transistor to thereby generate an amplified drain and gate voltage at said output pin.

18. The method according to claim 15 wherein said first NMOS transistor and said second NMOS transistor are the same size, the same layout orientation, and in close proximity.

19. The method according to claim 15 wherein said first internal resistance and said second internal resistance comprise the same resistance value.

20. A method of detecting a threshold voltage implantation reticle option layer in an integrated circuit device comprising:

selecting a first PMOS transistor in an integrated circuit device in a first test mode to couple the voltage at the drain and the gate of said first PMOS transistor to an output pin of said integrated circuit device wherein said gate and said drain of said first PMOS transistor are connected together, wherein the source of said first PMOS transistor is connected to an internal standard voltage, and wherein said first PMOS transistor has the standard threshold voltage implantation but not the threshold voltage implantation reticle option layer;

measuring said voltage at said output pin in said first test mode when said drain and said gate of said first PMOS transistor are connected to ground through a first internal standard resistance;

selecting a second PMOS transistor in said integrated circuit device in a second test mode to couple the voltage at the drain and the gate of said second PMOS transistor to said output pin of said integrated circuit device wherein said gate and said drain of said second PMOS transistor are connected together, wherein the source of said second PMOS transistor is connected to said internal standard voltage, and wherein said second PMOS transistor has both said standard threshold voltage implantation and said threshold voltage implantation reticle option layer;

measuring said voltage at said output pin in said second test mode when said drain and said gate of said second PMOS transistor are connected to said ground through a second internal standard resistance; and comparing said voltage at said output pin in said first test mode with said voltage at said output pin in said second test mode to detect the presence of said threshold voltage implantation reticle option layer in said integrated circuit device.

21. The method according to claim 20 wherein said selecting of said first PMOS transistor is by a multiplex circuit and wherein said selecting of said second PMOS is by a multiplex circuit.

22. The method according to claim 20 further comprising amplifying said voltage at said drain and said gate of said first PMOS transistor and said second PMOS transistor to thereby generate an amplified drain and gate voltage at said output pin.

23. The method according to claim 20 wherein said first PMOS transistor and said second PMOS transistor are the same size, the same layout orientation, and in close proximity.

24. The method according to claim 20 wherein said first internal resistance and said second internal resistance comprise the same resistance value.

* * * * *